United States Patent
Sundar et al.

(10) Patent No.: US 11,631,802 B2
(45) Date of Patent: Apr. 18, 2023

(54) ETCHING AND ENCAPSULATION SCHEME FOR MAGNETIC TUNNEL JUNCTION FABRICATION

(71) Applicant: Headway Technologies, Inc., Milpitas, CA (US)

(72) Inventors: Vignesh Sundar, Fremont, CA (US); Yi Yang, Fremont, CA (US); Dongna Shen, San Jose, CA (US); Zhongjian Teng, Santa Clara, CA (US); Jesmin Haq, Milpitas, CA (US); Sahil Patel, Sunnyvale, CA (US); Yu-Jen Wang, San Jose, CA (US); Tom Zhong, Saratoga, CA (US)

(73) Assignee: Headway Technologies, Inc., Milpitas, CA (US)

( * ) Notice: Subject to any disclaimer, the term of this patent is extended or adjusted under 35 U.S.C. 154(b) by 735 days.

(21) Appl. No.: 16/677,053

(22) Filed: Nov. 7, 2019

(65) Prior Publication Data

US 2021/0143322 A1 May 13, 2021

(51) Int. Cl.
| | | |
|---|---|---|
| *H01L 43/00* | (2006.01) | |
| *H01L 41/47* | (2013.01) | |
| *H01L 41/047* | (2006.01) | |
| *H01L 41/332* | (2013.01) | |
| *H01L 41/06* | (2006.01) | |
| *H01L 41/053* | (2006.01) | |
| *H01L 41/20* | (2006.01) | |

(52) U.S. Cl.
CPC .......... *H01L 41/47* (2013.01); *H01L 41/0474* (2013.01); *H01L 41/0533* (2013.01); *H01L 41/06* (2013.01); *H01L 41/20* (2013.01); *H01L 41/332* (2013.01); *H01L 43/00* (2013.01)

(58) Field of Classification Search
CPC . H01L 41/47; H01L 41/0474; H01L 41/0533; H01L 41/06; H01L 41/20; H01L 41/332; H01L 43/00; H01L 43/02; H01L 43/10; H01L 43/12; H01L 43/08
See application file for complete search history.

(56) References Cited

U.S. PATENT DOCUMENTS

| | | |
|---|---|---|
| 8,045,299 B2 | 10/2011 | Fontana, Jr. et al. |
| 8,324,698 B2 | 12/2012 | Zhong et al. |
| 8,330,196 B2 | 12/2012 | Marukame et al. |

(Continued)

*Primary Examiner* — Nilufa Rahim
(74) *Attorney, Agent, or Firm* — Saile Ackerman LLC; Stephen B. Ackerman; Rosemary L.S. Pike

(57) ABSTRACT

A plurality of conductive via connections are fabricated on a substrate located at positions where MTJ devices are to be fabricated, wherein a width of each of the conductive via connections is smaller than or equivalent to a width of the MTJ devices. The conductive via connections are surrounded with a dielectric layer having a height sufficient to ensure that at the end of a main MTJ etch, an etch front remains in the dielectric layer surrounding the conductive via connections. Thereafter, a MTJ film stack is deposited on the plurality of conductive via connections surrounded by the dielectric layer. The MTJ film stack is etched using an ion beam etch process (IBE), etching through the MTJ film stack and into the dielectric layer surrounding the conductive via connections to form the MTJ devices wherein by etching into the dielectric layer, re-deposition on sidewalls of the MTJ devices is insulating.

9 Claims, 2 Drawing Sheets

(56) References Cited

U.S. PATENT DOCUMENTS

| | | | |
|---|---|---|---|
| 8,828,742 B2 | 9/2014 | Iba | |
| 8,883,520 B2 | 11/2014 | Satoh et al. | |
| 9,647,203 B2 | 5/2017 | Kitagawa et al. | |
| 9,960,347 B2 | 5/2018 | Annunziata et al. | |
| 10,707,413 B1* | 7/2020 | Dutta | H01L 43/08 |
| 2013/0267042 A1* | 10/2013 | Satoh | H01L 27/222 |
| | | | 438/3 |
| 2018/0033957 A1* | 2/2018 | Zhang | H01L 43/12 |
| 2019/0103554 A1* | 4/2019 | Aggarwal | H01L 27/228 |
| 2020/0350494 A1* | 11/2020 | Dutta | H01L 27/1222 |
| 2020/0357850 A1* | 11/2020 | Huang | G11C 11/161 |
| 2022/0336731 A1* | 10/2022 | Yang | H01L 43/02 |

* cited by examiner

ETCHING AND ENCAPSULATION SCHEME FOR MAGNETIC TUNNEL JUNCTION FABRICATION

RELATED PATENT APPLICATION

This application is related to co-pending U.S. patent application (HT18-003) Ser. No. 15/947,512 filed on Apr. 6, 2018, assigned to the same assignee as the present application and herein incorporated by reference in its entirety.

TECHNICAL FIELD

This application relates to the general field of magnetic tunneling junctions (MTJ) and, more particularly, to etching methods for forming sub 100 nm MTJ structures.

BACKGROUND

Etching of Magnetic Tunnel Junctions (MTJs) using Ion Beam Etching (IBE) has become a popular technique to etch/define sub-100 nm tunnel junctions. One of the potential advantages of using this technique instead of Reactive Ion Etching (RIE) is that the damage mechanisms here are restricted to just physical damage, while in the case of RIE, we could have both physical and chemical mechanisms for damage to the MTJ.

In a typical IBE process, the substrate is placed in a vacuum chamber and exposed to a neutralized beam of Ar atoms (Kr, Xe, Ne etc. may also be used). An Ar plasma is first generated in a separate source chamber, then a system of grids is used to extract the beam to the main etch chamber and direct the beam towards the substrate. Along the path, electrons are introduced into the chamber to neutralize the Ar ions to then form a neutral Ar beam. The wafer is also typically maintained at a certain tilt angle with respect to the ion beam and rotated so that the etching is uniform. Upon bombardment with the substrate surface, atoms from the surface which are imparted with sufficient energy may be sputtered off or etched. Since IBE is a purely physical process, the species etched off from the wafer are not volatile in nature. These species may be imparted with sufficient kinetic energy to escape the wafer area and either stick to the etch chamber or be pumped out from the chamber. On the other hand, if there are any 'obstacles' in their path, such as another Magnetic Tunnel Junction pillar, the sputtered atoms will stick to the sides of these pillars.

Now, a typical MTJ film consists of a seed layer, a pinned layer, a tunnel barrier, free layer, oxide or other cap layers, etc. We can see that with the exception of the tunnel barrier and perhaps the oxide cap layer, most of the layers in the stack are conductive. If, while etching these layers, the conductive material deposits on the tunnel barrier, it will result in the formation of a shunting path across the tunnel barrier, which will either reduce the magnetoresistance (since this region will not contribute to MR) or will result in most/all of the current flowing through it and create a short. In order to prevent this, an additional sidewall IBE etch to physically remove the re-deposited species or an oxidation treatment to oxidize the re-deposited species and thus make them insulating will have to be performed, which may have other detrimental effects on the device performance.

In related co-pending patent application Ser. No. 15/947,512, we described a process flow wherein a via connection layer was formed on top of the bottom electrode. This via connection layer consisted of a metal pillar whose size is smaller than the Magnetic Tunnel Junction that it was connecting to the bottom electrode and this metal pillar was surrounded by a dielectric material. Method(s) used to fabricate these metal pillars were described. A process flow consisting of Reactive Ion Etching and Ion Beam Etching were used to fabricate ~30 nm pillars. A 'great' overetch during the MTJ etch was also taught, which prevented conductive re-deposition on the barrier sidewall, which instead occurred on the dielectric layer surrounding the metallic via connection.

In this disclosure, we describe some additional/alternate features of the via connection layer, additional features of the main MTJ etch, and a new encapsulation methodology.

Several patents teach methods of forming the bottom electrode to MTJ connection while avoiding re-deposition of metal on the MTJ sidewalls, including U.S. Pat. No. 8,324,698 (Zhong et al) and U.S. Pat. No. 8,883,520 (Satoh et al). Other patents teach oxidizing re-deposition, including U.S. Patent Application 2018/0033957 (Zhang et al) and U.S. Pat. No. 8,828,742 (Iba), U.S. Pat. No. 9,647,203 (Kitagawa et al), U.S. Pat. No. 8,045,299 (Fontana, Jr. et al), and U.S. Pat. No. 8,330,196 (Marukame et al). Finally, U.S. Pat. No. 9,960,347 (Annunziata et al) shows in-situ encapsulation after MTJ etch. All of these references are different from the present disclosure.

SUMMARY

It is an object of the present disclosure to provide an improved method of forming MTJ structures without re-deposition of metal materials on the tunnel barrier layer.

Another object of the present disclosure is to provide a method of forming a dielectric-enclosed via connection between the bottom electrode and overlying MTJ structures to prevent re-deposition of metal materials on the tunnel barrier layer.

Yet another object of the present disclosure is to provide a method of forming a dielectric-enclosed via connection between the bottom electrode and overlying MTJ structures wherein the via connection is narrower than the MTJ stack pattern to prevent re-deposition of metal materials on the tunnel barrier layer.

In accordance with the objectives of the present disclosure, a method for fabricating a magnetic tunneling junction (MTJ) structure is achieved. A plurality of conductive via connections are fabricated on a substrate wherein the conductive via-connections are located at positions where MTJ devices are to be fabricated, wherein a width of each of the plurality of conductive via connections is smaller than or equivalent to a width of the MTJ devices to be fabricated subsequently. The conductive via connections are surrounded with a dielectric layer wherein a height of the dielectric layer is sufficient to ensure that at the end of a main MTJ etch, an etch front remains in the dielectric layer surrounding the conductive via connections. Thereafter, a MTJ film stack is deposited on the plurality of conductive via connections surrounded by the dielectric layer. The MTJ film stack is etched using an ion beam etch process (IBE), wherein the IBE process etches through the MTJ film stack and into the dielectric layer surrounding the conductive via connections to form the MTJ devices wherein by etching into the dielectric layer, re-deposition on sidewalls of the MTJ devices is insulating.

Also in accordance with the objectives of the present disclosure, a method for fabricating a magnetic tunneling junction (MTJ) structure is achieved. A plurality of conductive via connections are fabricated on a substrate wherein the conductive via-connections are located at positions where MTJ devices are to be fabricated, wherein a width of each of the plurality of conductive via connections is smaller than or equivalent to a width of the MTJ devices to be fabricated subsequently. The conductive via connections are surrounded with a dielectric layer wherein a height of the dielectric layer is sufficient to ensure that at the end of a main MTJ etch, an etch front remains in the dielectric layer surrounding the conductive via connections. Thereafter, a MTJ film stack is deposited on the plurality of conductive via connections surrounded by the dielectric layer. The MTJ film stack is first etched using an ion beam etch process (IBE) at a first angle, wherein the IBE process etches through the MTJ film stack and into the dielectric layer surrounding the conductive via connections to form the MTJ devices wherein by etching into the dielectric layer, re-deposition on sidewalls of the MTJ devices is insulating. Thereafter, a second etching is performed using an ion beam etch process at a second angle smaller than the first angle to redeposit dielectric material from the dielectric layer onto the MTJ devices to act as a first encapsulation layer for the MTJ devices.

BRIEF DESCRIPTION OF THE DRAWINGS

In the accompanying drawings forming a material part of this description, there is shown.

DETAILED DESCRIPTION

In the integration scheme of the present disclosure, a via-connection layer consisting of metallic/conductive features in an insulating matrix is patterned, planarized, and polished/etched-back so that the tops of the metallic features are exposed. These conductive features form connections to the Magnetic Tunnel Junction (MTJ) pillars that are formed above them, where the MTJ pillars are etched using an Ion Beam Etching (IBE) process. More specifically, the conductive portions of the via-connection layer are patterned with a size similar to or smaller than the MTJ pillar, and with a height that allows a sufficient over-etch into the dielectric material surrounding the conductive features. On doing so, it was found that there is a clear reduction in the number of electrically shorted MTJ devices when such a via-connection layer is used as opposed to an etching scheme where the MTJ pillars are located on an 'infinite' conductive/metallic base layer. Features of this via-connection layer, the main MTJ etch, and the encapsulation processes are described in this disclosure.

As mentioned earlier, IBE is typically performed in an etch chamber where the ion beam is tilted with respect to the wafer and the wafer is rotated to ensure uniform ion milling across the whole wafer. The effect of angle on re-deposition thickness can be understood by considering re-deposition as a steady state between deposition of new material etched from the bottom of the trench and the etching of the sidewall itself by the ion beam. Typically, the smaller the angle between the normal to the wafer and the direction of the ion beam, the higher the re-deposition. Another consequence of tilting the wafer with respect to the ion beam is that the etch profile may not be perfectly vertical, as shown in FIGS. 1A-1C.

Figure 1A:
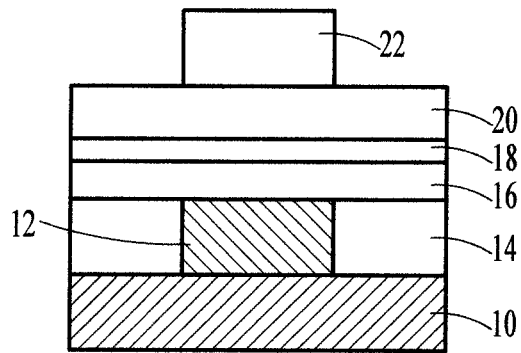
FIGS. 1A-1C are cross-sectional representations of re-deposition based on tilt angle.

FIG. 1A illustrates a bottom electrode 10 having via connection 12 formed thereon and surrounded by dielectric material 14. A stack of MTJ layers has been deposited on the via connection 12. These layers include seed and pinned layer 16, tunnel barrier layer 18, such as MgO, and free layer, capping layer, and any other layers 20. Hard mask 22 has been formed on the MTJ stack and patterned as shown.

Figure 1B:
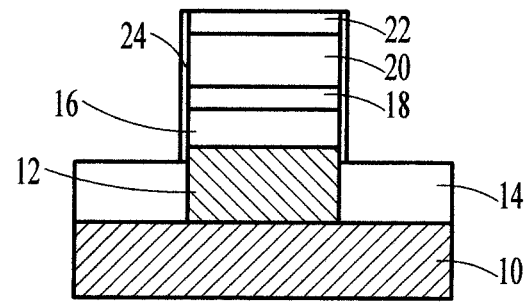
Figure 1C:
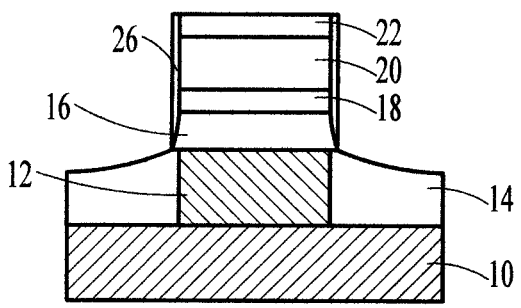

In FIGS. 1B and 1C, we see that the etch front is not the same close to the tunnel junction and further away, and that this depends on the angle/tilt used during the IBE. FIG. 1B illustrates the MTJ stack after it has been etched by IBE with no tilt angle. Conductive re-deposition 24 has been formed on the sidewalls of the MTJ stack. FIG. 1C illustrates the MTJ stack after it has been etched by IBE with a tilt angle. In this case, there has been an overetch into the dielectric layer 14 surrounding the via connection 12. Re-deposition 26 is insulating because it is from the dielectric layer 14.

Another important feature of IBE is 'inter-mixing' or 'knock-on.' Since the ion beam is initially generated as a plasma and accelerated using grids and directed at the wafer (and neutralized along the way), the beam still possesses considerable energy when it reaches the wafer surface. Depending on the energy of the incoming species as well as the material that is present on the surface, a situation could occur where atoms on the surface of the wafer get knocked further into the film rather than being sputtered off.

When the integration flow includes a via connection layer, particularly one which is smaller than the MTJ size, we see that when the MTJ film has been etched close to the MTJ, the etch then proceeds into the dielectric layer surrounding the MTJ. Thus the re-deposition, if any, on the sidewalls of the MTJ becomes insulating since it is from the dielectric layer surrounding the via connection layer. Now, as long as the first IBE etch step does not create significant re-deposition from the pinned and seed layers 16 (conductive layers below the MgO barrier in the MTJ), etching into the dielectric layer reduces the possibility of shunting paths across the MgO tunnel barrier 16 by one of two mechanisms: (1) the re-deposition on the MTJ sidewall predominantly consists of the dielectric layer 14 surrounding the via connection 12 and so is insulating, and (2) the dielectric layer surrounding the via connection 14 re-deposits on the sidewall of the MTJ and also intermixes with the sidewall; therefore, any conductive re-deposition from the seed layers/pinned layers on the MgO barrier 16 is rendered insulating due to this intermixing.

Further, while it is ideal to have a via connection (conductive portion) that is smaller than the MTJ pillar, it may be possible to have cases where the via connection is the same size or slightly larger than the MTJ—in these cases a combination of a larger etch angle for the main etch and a larger over-etch might be required to obtain desired properties.

While these mechanisms might be sufficient to effectively minimize conductive re-deposition on the sidewall of the MTJ, an additional oxidation treatment where the sidewall is exposed to either pure oxygen or ozone gases, an oxygen/ozone plasma or an oxygen/ozone radical shower might be included in the process flow to completely eliminate shorted devices across the entire wafer.

Once the MTJ etching is completed, the MTJ is then encapsulated with a dielectric material to electrically isolate it from other tunnel junctions and also protect it from corrosive elements in the atmosphere. Common processes used for this purpose are Physical Vapor Deposition (PVD), Chemical Vapor Deposition (CVD) or Atomic Layer Deposition (ALD). While any of these can be used, they all have advantages and disadvantages.

PVD deposition of insulating materials can be done in one of two ways—either using a metallic target and using reactive sputtering to form an insulator (for example, using a Si target and using Ar+$N_2$ plasma) or by using Radio Frequency sputtering to sputter directly from an insulating target (such as $SiN_x$). In either case, the MTJ sidewall is prone to damage from the reactive species present in the plasma, such as N and Ar radicals and/or ions, and in case the insulator is an oxide, it is also prone to oxidation from the Oxygen-based species in the plasma. In the case of CVD, which is used due to its superior gap-filling capabilities, the deposition is typically done at high temperatures (e.g. >200° C.) and reactive precursor materials are used. For instance, silane and ammonia could be used as precursors for the formation of $SiN_x$. Both silane and ammonia are extremely reactive and modify the MTJ sidewall upon interaction with it. High temperatures might cause diffusion of various species along the MTJ sidewall, once again modifying device properties. These challenges are also applicable in the case of Atomic Layer Deposition, where once again, reactive precursor materials and high temperatures are used.

In this disclosure, we propose to use the insulating matrix wherein the super-via is fabricated as the encapsulation material. The coverage of the tunnel junction sidewall using this material is accomplished by simply using a low angle (0 to 45°) (more typically between 0 and 20°) IBE step following the main MTJ etch. Note that at the end of the MTJ etch, as mentioned before, the insulator surrounding the conductive via-connection has already been accessed and partially etched into. Now, using a lower angle IBE etching step, the insulator surrounding the super-via metal will redeposit on to the MTJ sidewall as discussed before. Note that unlike PVD, since the IBE process is done with a neutral beam, the MTJ sidewall is not exposed to a reactive plasma. Note also that there are no reactive precursor species or materials used here, as the insulator is pre-fabricated during the super-via fabrication process.

The thickness of the re-deposited insulator, which is now the encapsulating layer for the MTJ, can be controlled by simply increasing the etch time of the low-angle etch. The re-deposited encapsulation thickness will also be relatively higher if a lower beam angle is used. That is, for the same etching time, a 0° etch step will create more re-deposition compared to a 20° etch step, the re-deposition here becoming the thickness of the encapsulation layer. Since this involves an additional etch into the dielectric layer, it might be necessary to fabricate the via connection layer with a higher thickness than for the previous integration. This is necessary to ensure that the additional etch step which is used to fabricate the encapsulation does not start etching the conductive bottom electrode layers. Once a sufficient thickness has been deposited and the sidewall is completely covered by this material (say 5-300 A), a second encapsulation layer can be deposited using typical PVD or CVD processes. Note that since the MTJ sidewall is already completely covered by the encapsulation-re-deposition layer, it will be protected from the processes used subsequently. This process is illustrated in FIGS. 2-4.

Figure 2:
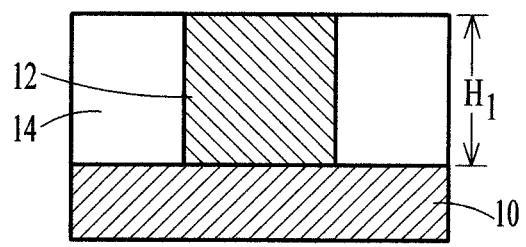
FIGS. 2-6 are cross-sectional representations of steps in a preferred embodiment of the present disclosure.

FIG. 2 illustrates a bottom electrode 10 having via connection 12 formed thereon and surrounded by dielectric material 14. In the fabrication of the via connection layer on the bottom electrode or substrate, the via connection layer consists of conductive pillars 12 in a dielectric matrix, where the conductive via connections are located at the positions where MTJ pillars are to be fabricated and provide a conductive path between the MTJ and the bottom electrode connections. The size (width) of the conductive portions 12 of the via connection layer are smaller than or equivalent to the size of the MTJ device to be fabricated subsequently. The height H1 of the via connection layer is sufficient to ensure that at the end of the main MTJ etch, the etch front remains in the dielectric layer surrounding the via connections. Preferably, the via connection 12 and dielectric layer 14 have a thickness H1 of between about 200 and 1500 Angstroms, or more than about 200 Angstroms. The required thickness H1 depends on the height of the MTJ. It should be at least one to three times taller than the MTJ (including or excluding the metal hard mask). If H1 is too thick, process difficulties will be introduced.

The dielectric layer 14 comprises oxides of Mg, Ta, Al, Ti, W, Mo, Zr, Hf, or Si, nitrides of Si, B, or Al or oxynitrides of Si, B, or Al which are insulating, or insulating carbides from materials such as B or Si. The dielectric layer is deposited using physical vapor deposition, chemical vapor deposition, atomic layer deposition, or ion beam deposition.

Figure 3:
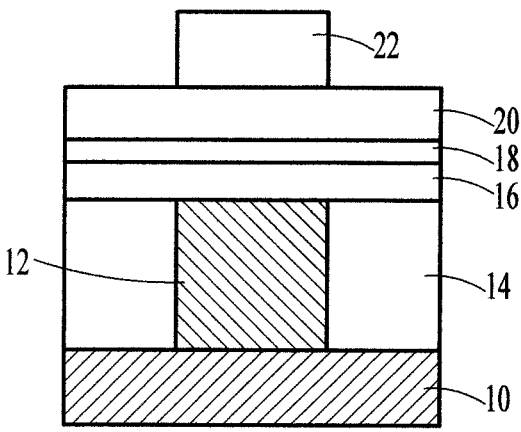
Figure 4:
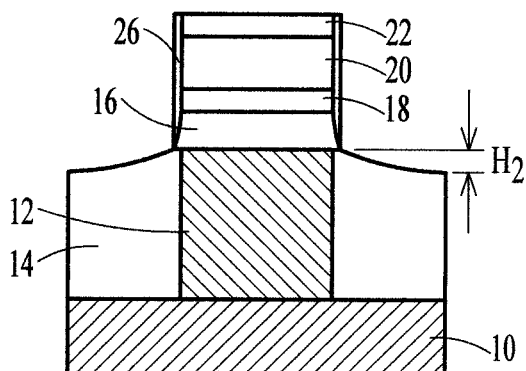

Referring now to FIG. 3, a stack of MTJ layers is deposited on the via connection 12. These layers include adhesion, seed, and pinned layer 16, tunnel barrier layer 18, such as MgO, and free layer, oxide or metallic capping layer, and any other layers 20. Hard mask 22 is formed on the MTJ stack and patterned as shown.

Next, as illustrated in FIG. 4, the MTJ stack is etched by IBE with a tilt angle of 0 to 50 degrees between the normal to the wafer and the direction of the ion beam. As shown in FIG. 4, there has been an overetch of thickness H2, about a few to 100 Angstroms, into the dielectric layer 14 surrounding the via connection 12. This overetch H2 depends on the main etching angle; a lower main etch angle usually need less overetch. The bottom line is to etch the unwanted MTJ layer completely. Re-deposition 26 is insulating because it is primarily from the dielectric layer 14 surrounding the via connection 12 or due to intermixing between the dielectric material and the conductive re-deposition on the MTJ sidewall. Once a sufficient thickness has been deposited on the sidewalls, preferably between about 10 and 200 A, and the sidewall is completely covered by re-deposition material 26, a second encapsulation layer 28 can be deposited using typical PVD or CVD processes.

Figure 5:
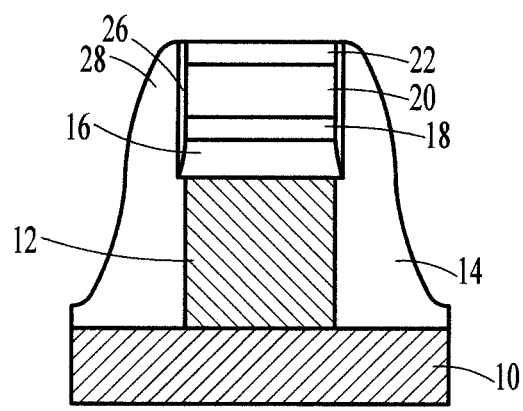
Figure 6:
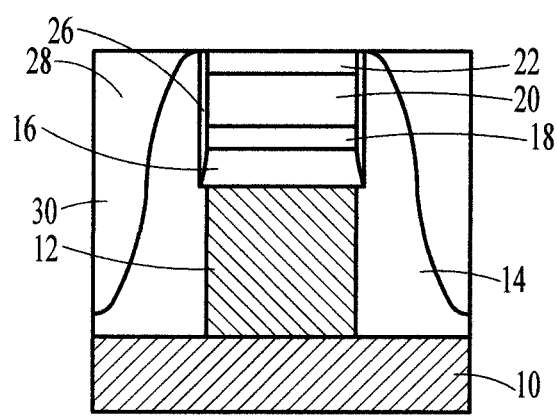

Alternatively, a second IBE with a lower angle than the first IBE process, preferably 0 to 45 degrees with respect to a normal line to the top surface of the MTJ devices, is now performed. This IBE will etch the dielectric layer 14 and re-deposit it as a first encapsulation layer 28, with a thickness of between about 5 and 300 Angstroms, as shown in FIG. 5. Then, with or without exposing the wafer to atmosphere, a final encapsulation layer 30 may be deposited by typical PVD or CVD processes, as shown in FIG. 6.

The MTJ etch is followed by an additional oxidation treatment to oxidize any remaining conductive re-deposition on the barrier layer of the MTJ device. The additional oxidation treatment may be either before or after the dielectric re-deposition, depending on the re-deposition thickness. In any case, the additional oxidation treatment must be prior to the final encapsulation step.

In a more generalized case, we can also note that this process is not restricted to IBE etched wafers. As long as the MTJ is fabricated on a via which is smaller or equivalent to the MTJ size and surrounded by an insulator, we can use RIE or other etching techniques to etch the tunnel junction and then use a low angle IBE etch step to redeposit the insulating layer to form an encapsulation layer around the MTJ.

This technique is particularly useful for the formation of oxide encapsulation layers. The typical methods described earlier such as PVD and CVD for the formation of oxide encapsulation layers will result in the exposure of the sidewall to reactive oxygen species, which will modify the sidewall behavior. Thus, even if an encapsulation material such as MgO or $TiO_2$ is desired since these are stable oxides and Mg and Ti are oxygen-getters (which will therefore retain the oxygen even at high temperatures and not cause sidewall oxidation), the formation of $TiO_2$ or Mg on the MTJ sidewall will cause sidewall oxidation.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. A method for magnetic tunnel junction (MTJ) fabrication comprising:
   fabricating a plurality of conductive via connections on a bottom electrode on a substrate wherein said conductive via-connections are located at positions where MTJ devices are to be fabricated, wherein a width of each of said plurality of conductive via connections is smaller than or equivalent to a width of said MTJ devices to be fabricated subsequently;
   surrounding said conductive via connections with a dielectric layer wherein a height of said dielectric layer is sufficient to ensure that at the end of a main MTJ etch, an etch front remains in said dielectric layer surrounding said conductive via connections;
   thereafter depositing a MTJ film stack on said plurality of conductive via connections surrounded by said dielectric layer;
   first etching said MTJ film stack using a main etch ion beam etch (IBE) process at a first angle, wherein said IBE process etches through said MTJ film stack and into said dielectric layer surrounding said conductive via connections to form said MTJ devices wherein by etching into said dielectric layer, re-deposition on sidewalls of said MTJ devices is insulating; and
   thereafter second etching using an ion beam etch process at a second angle smaller than said first angle to re-deposit dielectric material from said dielectric layer onto said MTJ device to act as a first encapsulation layer for said MTJ device.

2. The method according to claim 1 wherein said width of said conductive via connections is selected such that said IBE process for defining said MTJ devices does not result in etching of the conductive portion of said conductive via connection, instead said IBE process only affects said dielectric layer surrounding said conductive via connection.

3. The method according to claim 1 wherein said dielectric layer comprises oxides of Mg, Ta, Al, Ti, W, Mo, Zr, Hf, or Si, nitrides of Si, B, or Al or oxynitrides of Si, B, or Al which are insulating, or insulating carbides.

4. The method according to claim 1 wherein said dielectric layer is deposited using physical vapor deposition, chemical vapor deposition, atomic layer deposition, or ion beam deposition.

5. The method according to claim 1 wherein said MTJ film stack comprises adhesion layer(s), seed layer(s), pinned layer(s), tunnel barrier layer(s), free layer(s), oxide or metallic capping layers, and hard mask layer(s).

6. The method according to claim 1 where said first etching uses an ion beam angle of between 0° to 50° and said second etching uses an ion beam angle of between 0° to 45° with respect to a normal line to a top surface of said MTJ film stack.

7. The method according to claim 1 further comprising an additional oxidation treatment to oxidize any remaining conductive re-deposition on a barrier layer of said MTJ device.

8. The method according to claim 1 wherein said first encapsulation layer has a thickness of between about 5 and 300 Angstroms and further comprising forming a second encapsulation layer over said first encapsulation layer.

9. The method according to claim 8 wherein said second encapsulation is performed without exposure to atmosphere.

* * * * *